(12) United States Patent
Bazan et al.

(10) Patent No.: US 8,227,691 B2
(45) Date of Patent: Jul. 24, 2012

(54) PROCESSING ADDITIVES FOR FABRICATING ORGANIC PHOTOVOLTAIC CELLS

(75) Inventors: Guillermo Bazan, Santa Barbara, CA (US); Christoph Brabec, Linz (AT); Russell Gaudiana, Merrimack, NH (US); Alan J. Heeger, Santa Barbara, CA (US); Markus Koppe, Linz (AT); Jae Kwan Lee, Santa Barbara, CA (US); Wanli Ma, El Cerrito, CA (US); Mauro Morana, Linz (AT); Markus Scharber, Linz (AT); David Waller, Lexington, MA (US)

(73) Assignee: The Regents of the University of California, Santa Barbara, CA (US)

( * ) Notice: Subject to any disclaimer, the term of this patent is extended or adjusted under 35 U.S.C. 154(b) by 878 days.

(21) Appl. No.: 12/257,069

(22) Filed: Oct. 23, 2008

(65) Prior Publication Data

US 2009/0108255 A1 Apr. 30, 2009

Related U.S. Application Data

(60) Provisional application No. 60/984,229, filed on Oct. 31, 2007.

(51) Int. Cl.
*H01L 31/0216* (2006.01)
(52) U.S. Cl. .............................. 136/263; 136/244; 549/1
(58) Field of Classification Search ........ 549/1; 438/99; 524/82; 136/263, 244
See application file for complete search history.

(56) References Cited

U.S. PATENT DOCUMENTS

| | | | |
|---|---|---|---|
| 5,514,878 A | 5/1996 | Holmes et al. | |
| 5,986,206 A | 11/1999 | Kambe et al. | |
| 6,188,175 B1 | 2/2001 | May et al. | |
| 6,559,375 B1 | 5/2003 | Meissner et al. | |
| 6,683,244 B2 | 1/2004 | Fujimori et al. | |
| 6,891,191 B2 | 5/2005 | Xiao et al. | |
| 6,946,597 B2 | 9/2005 | Sager et al. | |
| 7,045,205 B1 | 5/2006 | Sager | |
| 7,329,709 B2 | 2/2008 | Gaudiana et al. | |
| 7,745,724 B2 | 6/2010 | Balasubramanian et al. | |
| 2002/0093005 A1 | 7/2002 | Sohn et al. | |
| 2003/0085397 A1 | 5/2003 | Geens et al. | |
| 2004/0007969 A1 | 1/2004 | Lu et al. | |
| 2004/0113903 A1 | 6/2004 | Mikami et al. | |
| 2004/0131934 A1 | 7/2004 | Sugnaux et al. | |
| 2004/0192830 A1* | 9/2004 | Zhang | 524/547 |
| 2004/0214041 A1 | 10/2004 | Lu et al. | |
| 2005/0092359 A1 | 5/2005 | Uchida et al. | |
| 2005/0279399 A1 | 12/2005 | Gaudiana et al. | |

(Continued)

FOREIGN PATENT DOCUMENTS

EP 1 447 860 8/2004

(Continued)

OTHER PUBLICATIONS

Chirvase et al. "Influence of nanomorphology on the photovoltaic action of polymer-fullerene composites" Nanotechnology 15, 1317-1323 (2004).*

(Continued)

*Primary Examiner* — Ling Choi
(74) *Attorney, Agent, or Firm* — Lumen Patent Firm

(57) ABSTRACT

Processing additives, as well as related compositions, photovoltaic cells, photovoltaic modules, and methods, are disclosed.

40 Claims, 2 Drawing Sheets

U.S. PATENT DOCUMENTS

| | | | |
|---|---|---|---|
| 2006/0025311 | A1 | 2/2006 | Brabec et al. |
| 2006/0076050 | A1 | 4/2006 | Williams et al. |
| 2006/0107996 | A1 | 5/2006 | Shaheen et al. |
| 2006/0174937 | A1* | 8/2006 | Zhou ............................ 136/263 |
| 2006/0211272 | A1 | 9/2006 | Lee et al. |
| 2006/0261314 | A1* | 11/2006 | Lang et al. .................... 252/500 |
| 2006/0292736 | A1 | 12/2006 | Lee et al. |
| 2007/0108539 | A1 | 5/2007 | Brabec et al. |
| 2007/0145324 | A1* | 6/2007 | Masuda .......................... 252/62 |
| 2007/0181177 | A9 | 8/2007 | Sager et al. |
| 2007/0215864 | A1 | 9/2007 | Luebben et al. |
| 2007/0246094 | A1 | 10/2007 | Brabec et al. |
| 2008/0315187 | A1 | 12/2008 | Bazan et al. |
| 2009/0032808 | A1 | 2/2009 | Bazan et al. |
| 2009/0194167 | A1 | 8/2009 | Brabec |
| 2010/0024860 | A1 | 2/2010 | He et al. |

FOREIGN PATENT DOCUMENTS

| | | |
|---|---|---|
| EP | 1 691 428 | 8/2006 |
| EP | 1 816 491 | 8/2007 |
| WO | WO 01/86734 | 11/2001 |
| WO | WO 2004/063277 | 7/2004 |
| WO | WO 2004/105150 | 12/2004 |
| WO | WO 2006/123167 | 11/2006 |
| WO | WO 2007/076427 | 7/2007 |
| WO | WO 2008/066933 | 6/2008 |
| WO | WO 2009/058811 | 5/2009 |

OTHER PUBLICATIONS

U.S. Appl. No. 11/949,705, filed Dec. 3, 2007, Bazan et al.

C.J. Brabec et al., "Plastic Solar Cells," Advanced Functional Materials, 11(1):15-26, 2001.

Chen et al., "Enhanced Efficiency of Plastic Photovoltaic Devices by Blending with Ionic Solid Electrolytes," Appl. Phys. Ltrs., 84(16):3181-3183, (2004).

Chirvase et al., "Influence of Nanomorphology on the Photovoltaic Action of Polymer-Fullerene Composites," Nanotechnology, 15:1317-1323, (2004).

Chirvase et al., "Temperature Dependent Characteristic of Poly(3Hexylthiophene)-Fullerene Based Heterojunction Organic Solar Cells," J. App. Phys., 93(6):3376-3383, (2003).

Coakley and McGehee, "Photovoltaic cells made from conjugated polymers infiltrated into mesoporous titania," Applied Physics Letters, 83(16):3380-3382, 2003.

Gao et al., "Efficient photodetectors and photovoltaic cells from composites of fullerenes and conjugated polymers: photoinduced electron transfer," International Conference on Science and Technology of Synthetic Metals (ICSM '96), Snowbird, UT, USA, Jul. 28-Aug. 2, 1996, vol. 84, No. 1-3, pp. 979-980.

Gunes et al., "Conjugated Polymer-Based Organic Solar Cells," Chem. Rev. 107(11):1324-1338, 2007.

Hoppe et al., "Morphology of polymer/fullerene bulk heterojunction solar cells," Journal of Materials chemistry, 2006, 16, 45-61.

Hoppe et al., "Nanoscale Morphology of Conjugated Polymer/Fullerene-Based Bulk-Heterojunction solar Cells," Advanced Functional Materials, 2004, 14(10):1005-1011.

Jenekhe et al., "Efficient photovoltaic cells from semiconducting polymer heterojunctions," Applied Physics Letters, 77(17):2635-2637, 2000.

Lee et al., "Processing Additives for Improved Efficiency from Bulk Heterojunction Solar Cells," J. Am. Chem. Soc., 130:3619-3623, (2008, e-pub. Feb. 21, 2008).

Li et al., "Investigation of Annealing Effects and Film Thickness Dependence of Polymer Solar Cells Based on Poly(3-Hexylthiophene)," J. Appl. Phys., 98(4):043704-1-043704-5, (2005).

Ma et al., "Thermally Stable, Efficinet Polymer Solar Cells with Nanoscale Control of the Interpenetrating Network Morphology," Adv. Funct. Mater., 15(10):1617-1622, (2005).

Martens et al., "Disclosure of the nanostructure of MDMO-PPV:PCBM bulk hetero-junction organic solar cells by a combination of SPM and TEM," Snythetic Metals 138:243-247, (2003).

Nguyen et al, "Controlling Interchain Interactions in Conjugated Polymers: The Effects of Chain Morphology on Exciton—Exciton Annihilation and Aggregation in MEH-PPV Films," J. Phys. Chem. B, 104:237-255, (2000, e-pub. Dec. 17, 1999).

Peet et al., "Morphological Control of P3HT/PCBM Thin Films for Enhanced Polymer Solar Cell Performance," Poster, presented at 2005 International chemical Congress of Pacific Basin Societies, Honolulu, Hawaii, Dec. 15-20, 2005, one page.

Rauch et al., "Performance of bulk-heterojunction organic photodetectors," 2004 4th IEEE Conference on Nanotechnology, pp. 632-634.

English Translation of WO/01/86734.

International Preliminary Report on Patentability mailed on Jun. 11, 2009 for PCT Application No. PCT/US2007/024792, filed on Dec. 3, 2007.

International Search Report mailed on Mar. 4, 2009 for PCT Application No. PCT/US2008/081514, filed on Oct. 29, 2008.

International Search Report mailed on May 7, 2008 for PCT Application No. PCT/US2007/024792, filed on Dec. 3, 2007.

Written Opinion mailed on Mar. 4, 2009 for PCT Application No. PCT/US2008/081514, filed on Oct. 29, 2008.

Written Opinion mailed on May 5, 2008, for PCT Application No. PCT/US2007/024792, filed on Dec. 3, 2007.

J. Peet, C. Soci, R. C. Coffin, T. Q. Nguyen, A Mikhailovsky, D. Moses and G. C. Bazan; Method for increasing the photoconductive response in conjugated polymer/fullerene composites; Applied Physics Letters; 89, 252105 (2006).

J. Peet, J.Y. Kim, N. E. Coates, W. L. Ma, D. Moses, A. J. Heeger and G. C. Bazan; Efficiency enhancement in low-bandgap polymer solar cells by processing with alkane dithiols; Nature Materials, vol. 6, Jul. 2007.

U.S. Appl. No. 11/949,705, filed Dec. 3, 2007, Bazan.

Barber et al, "Organic Photovoltaic devices based on a block copolymer/fullerene blend," Organic Electronics, 7, 2006, pp. 508-513.

Chirvase et al., "Electrical and optical design and characterization of regioregular poly(3-hexylthiophene-2, 5diylfullerene-based heterojunction polymer solar cells," Synthetic Metals, 138, 2003, pp. 299-304.

Riedel et al, "Polymer solar cells with novel fullerene-based acceptor," Thin Solid Films, 451-452, 2004 pp. 43-47.

* cited by examiner

PROCESSING ADDITIVES FOR FABRICATING ORGANIC PHOTOVOLTAIC CELLS

CROSS REFERENCE TO RELATED APPLICATION

Pursuant to 35 U.S.C. §119(e), this application claims priority to U.S. Provisional Application Ser. No. 60/984,229, filed Oct. 31, 2007, the contents of which are hereby incorporated by reference.

TECHNICAL FIELD

This disclosure relates to processing additives, as well as related compositions, photovoltaic cells, photovoltaic modules, and methods.

BACKGROUND

Photovoltaic cells are commonly used to transfer energy in the form of light into energy in the form of electricity. A typical photovoltaic cell includes a photoactive material disposed between two electrodes. Generally, light passes through one or both of the electrodes to interact with the photoactive material. As a result, the ability of one or both of the electrodes to transmit light (e.g., light at one or more wavelengths absorbed by a photoactive material) can limit the overall efficiency of a photovoltaic cell. In many photovoltaic cells, a film of semiconductive material (e.g., indium tin oxide) is used to form the electrode(s) through which light passes because, although the semiconductive material can have a lower electrical conductivity than electrically conductive materials, the semiconductive material can transmit more light than many electrically conductive materials.

SUMMARY

This disclosure relates to processing additives, as well as related compositions, photovoltaic cells, photovoltaic modules, and methods.

In one aspect, this disclosure features a composition that includes a polymer and a compound selected from a group consisting of an alkane substituted with halo, CN, or COOR, in which R is H or $C_1$-$C_{10}$ alkyl; a cyclopentadithiophene optionally substituted with $C_1$-$C_{10}$ alkyl; a fluorene optionally substituted with $C_1$-$C_{10}$ alkyl; a thiophene optionally substituted with $C_1$-$C_{10}$ alkyl; a benzothiadiazole optionally substituted with $C_1$-$C_{10}$ alkyl; a naphthalene optionally substituted with $C_1$-$C_{10}$ alkyl; and a 1,2,3,4-tetrahydronaphthalene optionally substituted with $C_1$-$C_{10}$ alkyl.

In another aspect, this disclosure features a composition that includes a polymer and a compound comprising a substituted alkane. At least one substituent on the alkane is not SH.

In another aspect, this disclosure features an article that includes a substrate and one of the above-described compositions. The composition is supported by the substrate.

In another aspect, this disclosure features an article that includes first and second electrodes, and a photoactive layer between the first and second electrodes. The photoactive layer includes at least two separated phases, in which at least one of the separated phases has an average grain size of at least about 20 nm. The article is configured as a photovoltaic cell.

In another aspect, this disclosure features an article that includes first and second electrodes and a photoactive layer between the first and second electrodes. The photoactive layer is formed by applying a solution comprising a compound onto the first or second electrode. The compound is selected from a group consisting of an alkane substituted with halo, CN, or COOR, R being H or $C_1$-$C_{10}$ alkyl; a cyclopentadithiophene optionally substituted with $C_1$-$C_{10}$ alkyl; a fluorene optionally substituted with $C_1$-$C_{10}$ alkyl; a thiophene optionally substituted with $C_1$-$C_{10}$ alkyl; a benzothiadiazole optionally substituted with $C_1$-$C_{10}$ alkyl; a naphthalene optionally substituted with $C_1$-$C_{10}$ alkyl; and a 1,2,3,4-tetrahydronaphthalene optionally substituted with $C_1$-$C_{10}$ alkyl. The article is configured as a photovoltaic cell.

In still another aspect, this disclosure features a method that includes processing a solution including a compound to form a photoactive layer. The compound is selected from a group consisting of an alkane substituted with halo, CN, or COOR, R being H or $C_1$-$C_{10}$ alkyl; a cyclopentadithiophene optionally substituted with $C_1$-$C_{10}$ alkyl; a fluorene optionally substituted with $C_1$-$C_{10}$ alkyl; a thiophene optionally substituted with $C_1$-$C_{10}$ alkyl; a benzothiadiazole optionally substituted with $C_1$-$C_{10}$ alkyl; a naphthalene optionally substituted with $C_1$-$C_{10}$ alkyl; and a 1,2,3,4-tetrahydronaphthalene optionally substituted with $C_1$-$C_{10}$ alkyl.

Embodiments can include one or more of the following features.

In some embodiments, the compound is an alkane substituted with Cl, Br, I, CN, or $COOCH_3$.

In some embodiments, the alkane is a $C_6$-$C_{12}$ alkane, such as octane.

In some embodiments, the compound is 1,8-diiodooctane, 1,8-dibromooctane, 1,8-dicyanooctane, or 1,8-di(methoxycarbonyl)octane.

In some embodiments, the compound is of the following formula: $R_1$—$(CH_2)_n$—$R_2$, in which n is 1-20; and each of $R_1$ and $R_2$, independently, is halo, CN, or COOR, R being H or $C_1$-$C_{10}$ alkyl. For example, n can be 6-12, such as 8. In some embodiments, each of $R_1$ and $R_2$, independently, is Cl, Br, I, CN, or $COOCH_3$.

In some embodiments, the composition includes at least about 1 vol % and/or at most about 10 vol % of the compound.

In some embodiments, the polymer includes an electron donor material. The electron donor material can be selected from the group consisting of polythiophenes, polyanilines, polycarbazoles, polyvinylcarbazoles, polyphenylenes, polyphenylvinylenes, polysilanes, polythienylenevinylenes, polyisothianaphthanenes, polycyclopentadithiophenes, polysilacyclopentadithiophenes, polycyclopentadithiazoles, polythiazolothiazoles, polythiazoles, polybenzothiadiazoles, poly(thiophene oxide)s, poly(cyclopentadithiophene oxide)s, polythiadiazoloquinoxaline, polybenzoisothiazole, polybenzothiazole, polythienothiophene, poly(thienothiophene oxide), polydithienothiophene, poly(dithienothiophene oxide)s, polytetrahydroisoindoles, and copolymers thereof. In certain embodiments, the electron donor material can include polythiophenes, polycyclopentadithiophenes, or copolymers thereof. For example, the electron donor material can include poly(3-hexylthiophene) or poly(cyclopentadithiophene-co-benzothiadiazole).

In some embodiments, the composition can further include an electron acceptor material. The electron acceptor material can include a material selected from the group consisting of fullerenes, inorganic nanoparticles, oxadiazoles, discotic liquid crystals, carbon nanorods, inorganic nanorods, polymers containing CN groups, polymers containing $CF_3$ groups, and combinations thereof. In certain embodiments, the electron acceptor material can include a substituted fullerene, such as [6,6]-phenyl C61-butyric acid methyl ester ($C_{61}$-PCBM) or [6,6]-phenyl C71-butyric acid methyl ester ($C_{71}$-PCBM).

In some embodiments, the composition can further include a solvent, such as an organic solvent. Examples of suitable solvents include chlorobenzene, o-dichlorobenzene, trichlorobenzene, o-xylene, m-xylene, p-xylene, toluene, mesitylene, ethylbenzene, isobutylbenzene, t-butylbenzene, α-methylnaphthalene, tetralin, N-methylpyrrolidone, methyl ethyl ketone, or acetone.

In some embodiments, the average grain size is at least about 50 m (e.g., at least about 100 nm).

In some embodiments, the processing step includes applying the solution on a surface. The processing step can also include drying the solution after the applying step to form the photoactive layer.

In some embodiments, the method can further include disposing the photoactive layer between first and second electrodes to form a photovoltaic cell.

Embodiments can include one or more of the following advantages.

In some embodiments, the processing additive selectively dissolves the electron acceptor material (e.g., a PCBM), but does not substantially dissolve the electron donor material (e.g., a polythiophene such as poly(3-hexylthiophene) (P3HT)). As such, when the coating composition containing such a processing additive is applied to a surface to form a photoactive layer, the processing additive facilitates phase separation between the electron acceptor material and the electron donor material in the photoactive layer and therefore enhances the efficiency of the photovoltaic cell thus formed.

In some embodiments, the processing additive has a higher boiling temperature than the solvent in the coating composition. In such embodiments, it is believed that, during the drying of the coating composition to form a photoactive layer, the electron acceptor material tends to remain in solution longer than the electron donor material, thereby facilitating phase separation between these two photoactive materials and resulting in an enhanced efficiency of the photovoltaic cell thus formed.

Other features and advantages will be apparent from the description, drawings and claims.

DESCRIPTION OF DRAWINGS

Like reference symbols in the various drawings indicate like elements.

DETAILED DESCRIPTION

Figure 1:
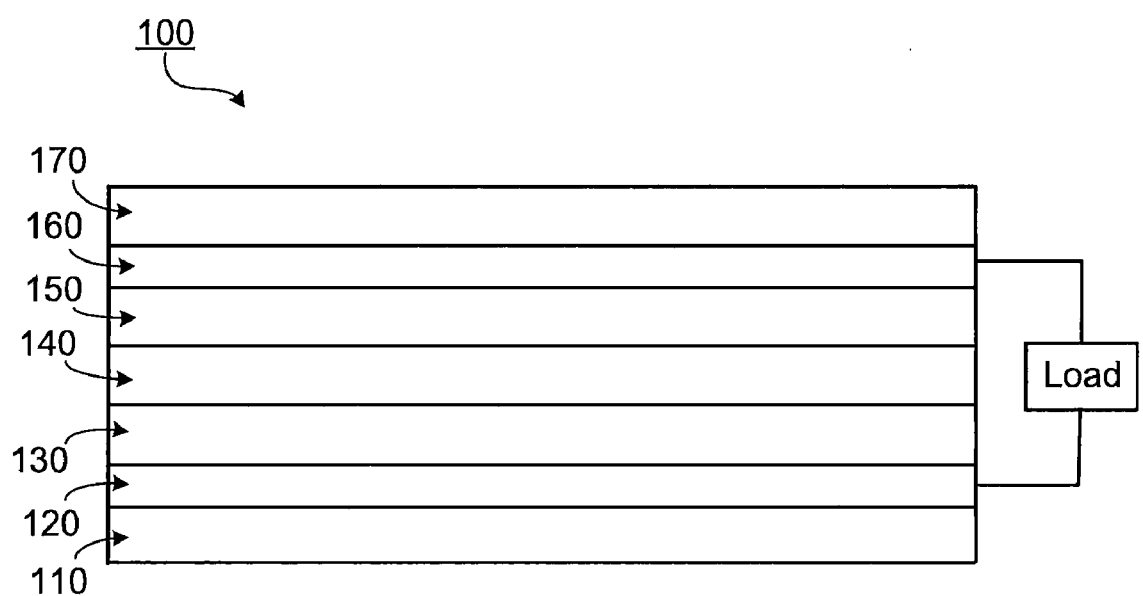
FIG. 1 is a cross-sectional view of an embodiment of a photovoltaic cell.

FIG. 1 shows a cross-sectional view of a photovoltaic cell 100 that includes a substrate 110, a cathode 120, a hole carrier layer 130, a photoactive layer 140, a hole blocking layer 150, an anode 160, and a substrate 170. Cathode 120 and anode 160 are electrically connected to an external load.

The photoactive layer 140 can generally be prepared by a liquid-based coating process. The term "liquid-based coating process" mentioned herein refers to a process that uses a liquid-based coating composition. Examples of liquid-based coating compositions can include a solution, a dispersion, and a suspension.

In general, the liquid based coating composition can include a processing additive, photoactive materials (such as an electron acceptor material and an electron donor material), and a solvent.

In some embodiments, the processing additive is a substituted alkane, in which at least one substituent is not a thiol group (SH). The term "alkane" used herein includes both branched and linear alkane compounds. In certain embodiments, the processing additive can include an alkane substituted with halo (e.g., Cl, Br, or I), CN, or COOR, in which R is H or $C_1$-$C_{10}$ alkyl (e.g., $CH_3$). In some embodiments, the alkane is a $C_6$-$C_{12}$ alkane (such as octane). In certain embodiments, the processing additive is of the following formula:

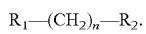

In this formula, n is an integer from 1 to 20; and each of $R_1$ and $R_2$, independently, is halo (e.g., Cl, Br, or I), CN, or COOR, R being H or $C_1$-$C_{10}$ alkyl. In some embodiments, n is an integer from 6 to 12, such as 8. Examples of processing additives include 1,8-diiodooctane, 1,8-dibromooctane, 1,8-dicyanooctane, or 1,8-di(methoxycarbonyl)octane.

In some embodiments, the processing additive is an aromatic compound. Examples of suitable aromatic compounds that can be used as a processing additive include cyclopentadithiophenes optionally substituted with $C_1$-$C_{10}$ alkyl (e.g.,

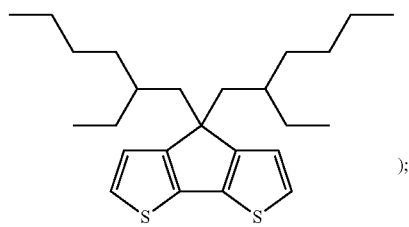

);

fluorenes optionally substituted with $C_1$-$C_{10}$ alkyl (e.g.,

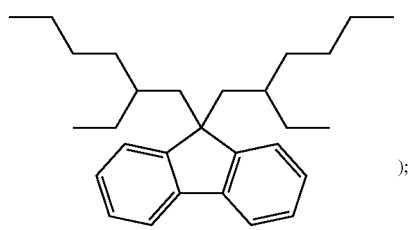

);

thiophenes optionally substituted with $C_1$-$C_{10}$ alkyl (e.g., thiophene, 2-methylthiophene, or 3-methylthiophene); benzothiadiazoles optionally substituted with $C_1$-$C_{10}$ alkyl (e.g., benzo[c][1,2,5]thiadiazole); naphthalenes optionally substituted with $C_1$-$C_{10}$ alkyl (e.g., 1-methylnaphthalene); and 1,2,3,4-tetrahydronaphthalenes optionally substituted with $C_1$-$C_{10}$ alkyl.

In some embodiments, the coating composition includes at least about 1 vol % (e.g., at least about 2 vol %, at least about 3 vol %, at least about 4 vol %, or at least about 5 vol %) and/or at most about 10 vol % (e.g., at most about 9 vol %, at most about 8 vol %, at most about 7 vol %, or at most about 6 vol %) of the processing additive. In certain embodiments, the coating composition includes about 2.0-3.0 vol % (e.g., 2.5-3.0 vol %) of the processing additive.

Without wishing to be bound by theory, it is believed that, in some embodiments, the processing additive dissolves the electron acceptor material (e.g., a PCBM), but does not substantially dissolve the electron donor material (e.g., a polythiophene such as P3HT). As such, when the coating composition containing such a processing additive is applied to a surface to form photoactive layer 140, the processing additive facilitates phase separation between the electron acceptor material and the electron donor material in photoactive layer 140 and therefore enhances the efficiency of the photovoltaic cell thus formed.

In some embodiments, the processing additive has a boiling point of at least about 100° C. (e.g., at least about 150° C., at least about 200° C., at least about 250° C., at least about 300° C.).

In some embodiments, the processing additive has a boiling point of at least about 30° C. (e.g., at least about 50° C., at least about 70° C., at least about 100° C., at least about 120° C., or at least about 150° C.) higher than that of the solvent in the coating composition. In such embodiments, it is believed that, during the drying of the coating composition to form photoactive layer 140, the electron acceptor material tends to remain in solution longer than the electron donor material, thereby facilitating phase separation between these two photoactive materials and enhancing the efficiency of the photovoltaic cell thus formed.

In some embodiments, photoactive layer 140 prepared by using a processing additive described above can have at least two separated phases where at least one of the two phases has an average grain size of at least about 20 nm (e.g., at least about 50 nm or at least about 100 nm). Without wishing to be bound by theory, it is believed that a larger separated phase in a photoactive layer can enhance the power-conversion efficiency of the photovoltaic cell. Further, in some embodiments, using a processing additive can reduce the need of post-processing (e.g., temperature annealing or solvent annealing) of photoactive layer 140.

In some embodiments, a photovoltaic cell containing a photoactive layer prepared by using a processing additive described above can have a power-conversion efficiency of at least about 2% (e.g., at least about 4%, at least about 5%, or at least about 6%) under AM 1.5 illumination condition.

In some embodiments, the solvent can be an organic solvent, such as chlorobenzene, o-dichlorobenzene, trichlorobenzene, o-xylene, m-xylene, p-xylene, toluene, mesitylene, ethylbenzene, isobutylbenzene, t-butylbenzene, α-methylnaphthalene, tetralin, N-methylpyrrolidone, methyl ethyl ketone, or acetone. In some embodiments, the solvent can be a mixture of the exemplary solvent mentioned above.

The concentrations of the photoactive materials in a liquid-based coating composition can generally be adjusted as desired. For example, the composition can include at least about 0.5 wt % (e.g., at least about 0.7 wt %, at least about 0.8 wt %, at least about 0.9 wt %, or at least about 1.0 wt %) of the electron donor material. As another example, the composition can include at least about 0.5 wt % (e.g., at least about 1.0 wt %, at least about 1.5 wt %, at least about 2.0 wt %, at least about 2.5 wt %, at least about 3.0 wt %, or at least about 3.5 wt %) of the electron acceptor material. In some embodiments, the concentrations can be adjusted to achieve a desired viscosity of the coating composition or a desired thickness of the coating.

In some embodiments, the weight ratio between the electron acceptor material and the electron donor material can be at least about 0.5:1 (e.g., at least about 1:1, at least about 1.5:1, at least about 2:1, at least about 2.5:1, at least about 3:1, at least about 3.5:1, at least about 4:1, at least about 4.5:1, or at least 5:1).

The liquid-based coating process mentioned above can be carried out by using at least one of the following processes: solution coating, ink jet printing, spin coating, dip coating, knife coating, bar coating, spray coating, roller coating, slot coating, gravure coating, flexographic printing, or screen printing. Without wishing to be bound by theory, it is believed that the liquid-based coating process can be readily used in a continuous manufacturing process, such as a roll-to-roll process, thereby significantly reducing the cost of preparing a photovoltaic cell. Examples of roll-to-roll processes have been described in, for example, co-pending U.S. Application Publication No. 2005-0263179, the contents of which are hereby incorporated by reference.

In some embodiments, when photoactive layer 140 includes organic photoactive materials, the liquid-based coating process can be carried out by mixing the organic photoactive materials and a processing additive with a solvent (e.g., an organic solvent) to form a solution or a dispersion, coating the solution or dispersion on a substrate, and drying the coated solution or dispersion. For example, an organic photoactive layer can be prepared by mixing an electron donor material (e.g., P3HT), an electron acceptor material (e.g., a PCBM), and a processing additive (e.g., 1,8-diiodooctane) in a suitable solvent (e.g., chlorobenzene) to form a solution, coating the solution onto a substrate, and drying the coated solution. Typically, the processing additive is removed during the drying of the coated solution. However, in some embodiments, at least some of the processing additive remains in the photoactive layer after the drying is complete. In such embodiments, the processing additives can be at least about 0.1 wt % (e.g., at least about 1 wt %, at least about 5 wt %, or at least about 10 wt %) of photoactive layer 140.

In some embodiments, the liquid-based coating process used to prepare a layer containing an inorganic photoactive material can be the same as that used to prepare a layer containing an inorganic photoactive material.

The liquid-based coating process can be carried out at an elevated temperature (e.g., at least about 50° C., at least about 100° C., at least about 200° C., or at least about 300° C.). The temperature can be adjusted depending on various factors, such as the coating process and the coating composition used. For example, when preparing a layer containing inorganic nanoparticles, the nanoparticles can be sintered at a high temperature (e.g., at least about 300° C.) to form interconnected nanoparticles. On the other hand, when a polymeric linking agent (e.g., poly(n-butyl titanate)) is added to the inorganic nanoparticles, the sintering process can be carried out at a lower temperature (e.g., below about 300° C.).

Turning to other components of photovoltaic cell 100, substrate 110 is generally formed of a transparent material. As referred to herein, a transparent material is a material which, at the thickness used in a photovoltaic cell 100, transmits at least about 60% (e.g., at least about 70%, at least about 75%, at least about 80%, at least about 85%) of incident light at a wavelength or a range of wavelengths used during operation of the photovoltaic cell. Exemplary materials from which substrate 110 can be formed include polyethylene terephthalates, polyimides, polyethylene naphthalates, polymeric hydrocarbons, cellulosic polymers, polycarbonates, polyamides, polyethers, and polyether ketones. In certain embodiments, the polymer can be a fluorinated polymer. In some embodiments, combinations of polymeric materials are used. In certain embodiments, different regions of substrate 110 can be formed of different materials.

In general, substrate 110 can be flexible, semi-rigid or rigid (e.g., glass). In some embodiments, substrate 110 has a flexural modulus of less than about 5,000 megaPascals (e.g., less than about 1,000 megaPascals or less than about 5,000 megaPascals). In certain embodiments, different regions of substrate 110 can be flexible, semi-rigid, or inflexible (e.g., one or more regions flexible and one or more different regions semi-rigid, one or more regions flexible and one or more different regions inflexible).

Typically, substrate 110 is at least about one micron (e.g., at least about five microns, at least about 10 microns) thick and/or at most about 1,000 microns (e.g., at most about 500 microns thick, at most about 300 microns thick, at most about 200 microns thick, at most about 100 microns, at most about 50 microns) thick.

Generally, substrate 110 can be colored or non-colored. In some embodiments, one or more portions of substrate 110 is/are colored while one or more different portions of substrate 110 is/are non-colored.

Substrate 110 can have one planar surface (e.g., the surface on which light impinges), two planar surfaces (e.g., the surface on which light impinges and the opposite surface), or no planar surfaces. A non-planar surface of substrate 110 can, for example, be curved or stepped. In some embodiments, a non-planar surface of substrate 110 is patterned (e.g., having patterned steps to form a Fresnel lens, a lenticular lens or a lenticular prism).

Cathode 120 is generally formed of an electrically conductive material. Exemplary electrically conductive materials include electrically conductive metals, electrically conductive alloys, electrically conductive polymers, and electrically conductive metal oxides. Exemplary electrically conductive metals include gold, silver, copper, aluminum, nickel, palladium, platinum, and titanium. Exemplary electrically conductive alloys include stainless steel (e.g., 332 stainless steel, 316 stainless steel), alloys of gold, alloys of silver, alloys of copper, alloys of aluminum, alloys of nickel, alloys of palladium, alloys of platinum and alloys of titanium. Exemplary electrically conducting polymers include polythiophenes (e.g., PEDOT), polyanilines (e.g., doped polyanilines), polypyrroles (e.g., doped polypyrroles). Exemplary electrically conducting metal oxides include indium tin oxide, fluorinated tin oxide, tin oxide and zinc oxide. In some embodiments, combinations of electrically conductive materials are used.

In some embodiments, cathode 120 can include a mesh electrode. Examples of mesh electrodes are described in co-pending U.S. Patent Application Publication Nos. 20040187911 and 20060090791, the entire contents of which are hereby incorporated by reference.

Hole carrier layer 130 is generally formed of a material that, at the thickness used in photovoltaic cell 100, transports holes to cathode 120 and substantially blocks the transport of electrons to cathode 120. Examples of materials from which layer 130 can be formed include polythiophenes (e.g., PEDOT), polyanilines, polycarbazoles, polyvinylcarbazoles, polyphenylenes, polyphenylvinylenes, polysilanes, polythienylenevinylenes, polyisothianaphthanenes, and copolymers thereof. In some embodiments, hole carrier layer 130 can include combinations of hole carrier materials.

In general, the thickness of hole carrier layer 130 (i.e., the distance between the surface of hole carrier layer 130 in contact with photoactive layer 140 and the surface of cathode 120 in contact with hole carrier layer 130) can be varied as desired. Typically, the thickness of hole carrier layer 130 is at least 0.01 micron (e.g., at least about 0.05 micron, at least about 0.1 micron, at least about 0.2 micron, at least about 0.3 micron, or at least about 0.5 micron) and/or at most about five microns (e.g., at most about three microns, at most about two microns, or at most about one micron). In some embodiments, the thickness of hole carrier layer 130 is from about 0.01 micron to about 0.5 micron.

In some embodiments, hole carrier layer 130 can be prepared by the liquid-based coating process described above.

In some embodiments, photoactive layer 140 contains photoactive materials, such as an electron acceptor material (e.g., an organic electron acceptor material) and an electron donor material (e.g., an organic electron donor material).

Examples of electron acceptor materials include fullerenes, inorganic nanoparticles, oxadiazoles, discotic liquid crystals, carbon nanorods, inorganic nanorods, polymers containing moieties capable of accepting electrons or forming stable anions (e.g., polymers containing CN groups or polymers containing $CF_3$ groups), and combinations thereof. In some embodiments, the electron acceptor material is a substituted fullerene (e.g., $C_{61}$-PCBM or $C_{71}$-PCBM). In some embodiments, a combination of electron acceptor materials can be used in photoactive layer 140.

Examples of electron donor materials include conjugated polymers, such as polythiophenes, polyanilines, polycarbazoles, polyvinylcarbazoles, polyphenylenes, polyphenylvinylenes, polysilanes, polythienylenevinylenes, polyisothianaphthanenes, polycyclopentadithiophenes, polysilacyclopentadithiophenes, polycyclopentadithiazoles, polythiazolothiazoles, polythiazoles, polybenzothiadiazoles, poly(thiophene oxide)s, poly(cyclopentadithiophene oxide)s, polythiadiazoloquinoxalines, polybenzoisothiazoles, polybenzothiazoles, polythienothiophenes, poly(thienothiophene oxide)s, polydithienothiophenes, poly(dithienothiophene oxide)s, polyfluorenes, polytetrahydroisoindoles, and copolymers thereof. In some embodiments, the electron donor material can be polythiophenes (e.g., poly(3-hexylthiophene)), polycyclopentadithiophenes, and copolymers thereof. In certain embodiments, a combination of electron donor materials can be used in photoactive layer 140.

In some embodiments, the electron donor materials or the electron acceptor materials can include a polymer having a first comonomer repeat unit and a second comonomer repeat unit different from the first comonomer repeat unit. The first comonomer repeat unit can include a cyclopentadithiophene moiety, a silacyclopentadithiophene moiety, a cyclopentadithiazole moiety, a thiazolothiazole moiety, a thiazole moiety, a benzothiadiazole moiety, a thiophene oxide moiety, a cyclopentadithiophene oxide moiety, a polythiadiazoloquinoxaline moiety, a benzoisothiazole moiety, a benzothiazole moiety, a thienothiophene moiety, a thienothiophene oxide moiety, a dithienothiophene moiety, a dithienothiophene oxide moiety, or a tetrahydroisoindoles moiety.

In some embodiments, the first comonomer repeat unit includes a cyclopentadithiophene moiety. In some embodiments, the cyclopentadithiophene moiety is substituted with at least one substituent selected from the group consisting of $C_1$-$C_{20}$ alkyl, $C_1$-$C_{20}$ alkoxy, $C_3$-$C_{20}$ cycloalkyl, $C_1$-$C_{20}$ heterocycloalkyl, aryl, heteroaryl, halo, CN, OR, C(O)R, C(O)OR, and $SO_2R$; R being H, $C_1$-$C_{20}$ alkyl, $C_1$-$C_{20}$ alkoxy, aryl, heteroaryl, $C_3$-$C_{20}$ cycloalkyl, or $C_1$-$C_{20}$ heterocycloalkyl. For example, the cyclopentadithiophene moiety can be substituted with hexyl, 2-ethylhexyl, or 3,7-dimethyloctyl. In certain embodiments, the cyclopentadithiophene moiety is substituted at 4-position. In some embodiments, the first comonomer repeat unit can include a cyclopentadithiophene moiety of formula (1):

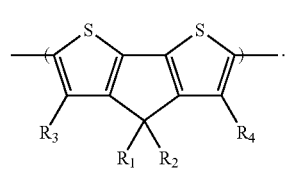

(1)

In formula (1), each of $R_1$, $R_2$, $R_3$, or $R_4$, independently, is H, $C_1$-$C_{20}$ alkyl, $C_1$-$C_{20}$ alkoxy, $C_3$-$C_{20}$ cycloalkyl, $C_1$-$C_{20}$ heterocycloalkyl, aryl, heteroaryl, halo, CN, OR, C(O)R, C(O)OR, or $SO_2R$; R being H, $C_1$-$C_{20}$ alkyl, $C_1$-$C_{20}$ alkoxy, aryl, heteroaryl, $C_3$-$C_{20}$ cycloalkyl, or $C_1$-$C_{20}$ heterocycloalkyl. For example, each of $R_1$ and $R_2$, independently, can be hexyl, 2-ethylhexyl, or 3,7-dimethyloctyl.

An alkyl can be saturated or unsaturated and branch or straight chained. A $C_1$-$C_{20}$ alkyl contains 1 to 20 carbon atoms (e.g., one, two, three, four, five, six, seven, eight, nine, 10, 11, 12, 13, 14, 15, 16, 17, 18, 19, and 20 carbon atoms). Examples of alkyl moieties include —$CH_3$, —$CH_2$—, —$CH_2$=$CH_2$—, —$CH_2$—CH=$CH_2$, and branched —$C_3H_7$. An alkoxy can be branch or straight chained and saturated or unsaturated. An $C_1$-$C_{20}$ alkoxy contains an oxygen radical and 1 to 20 carbon atoms (e.g., one, two, three, four, five, six, seven, eight, nine, 10, 11, 12, 13, 14, 15, 16, 17, 18, 19, and 20 carbon atoms). Examples of alkoxy moieties include —$OCH_3$ and —OCH=CH—$CH_3$. A cycloalkyl can be either saturated or unsaturated. A $C_3$-$C_{20}$ cycloalkyl contains 3 to 20 carbon atoms (e.g., three, four, five, six, seven, eight, nine, 10, 11, 12, 13, 14, 15, 16, 17, 18, 19, and 20 carbon atoms). Examples of cycloalkyl moeities include cyclohexyl and cyclohexen-3-yl. A heterocycloalkyl can also be either saturated or unsaturated. A $C_3$-$C_{20}$ heterocycloalkyl contains at least one ring heteroatom (e.g., O, N, and S) and 3 to 20 carbon atoms (e.g., three, four, five, six, seven, eight, nine, 10, 11, 12, 13, 14, 15, 16, 17, 18, 19, and 20 carbon atoms). Examples of heterocycloalkyl moieties include 4-tetrahydropyranyl and 4-pyranyl. An aryl can contain one or more aromatic rings. Examples of aryl moieties include phenyl, phenylene, naphthyl, naphthylene, pyrenyl, anthryl, and phenanthryl. A heteroaryl can contain one or more aromatic rings, at least one of which contains at least one ring heteroatom (e.g., O, N, and S). Examples of heteroaryl moieties include furyl, furylene, fluorenyl, pyrrolyl, thienyl, oxazolyl, imidazolyl, thiazolyl, pyridyl, pyrimidinyl, quinazolinyl, quinolyl, isoquinolyl, and indolyl.

Alkyl, alkoxy, cycloalkyl, heterocycloalkyl, aryl, and heteroaryl mentioned herein include both substituted and unsubstituted moieties, unless specified otherwise. Examples of substituents on cycloalkyl, heterocycloalkyl, aryl, and heteroaryl include $C_1$-$C_{20}$ alkyl, $C_3$-$C_{20}$ cycloalkyl, $C_1$-$C_{20}$ alkoxy, aryl, aryloxy, heteroaryl, heteroaryloxy, amino, $C_1$-$C_{10}$ alkylamino, $C_1$-$C_{20}$ dialkylamino, arylamino, diarylamino, hydroxyl, halogen, thio, $C_1$-$C_{10}$ alkylthio, arylthio, $C_1$-$C_{10}$ alkylsulfonyl, arylsulfonyl, cyano, nitro, acyl, acyloxy, carboxyl, and carboxylic ester. Examples of substituents on alkyl include all of the above-recited substituents except $C_1$-$C_{20}$ alkyl. Cycloalkyl, heterocycloalkyl, aryl, and heteroaryl also include fused groups.

The second comonomer repeat unit can include a benzothiadiazole moiety, a thiadiazoloquinoxaline moiety, a cyclopentadithiophene oxide moiety, a benzoisothiazole moiety, a benzothiazole moiety, a thiophene oxide moiety, a thienothiophene moiety, a thienothiophene oxide moiety, a dithienothiophene moiety, a dithienothiophene oxide moiety, a tetrahydroisoindole moiety, a fluorene moiety, a silole moiety, a cyclopentadithiophene moiety, a fluorenone moiety, a thiazole moiety, a selenophene moiety, a thiazolothiazole moiety, a cyclopentadithiazole moiety, a naphthothiadiazole moiety, a thienopyrazine moiety, a silacyclopentadithiophene moiety, an oxazole moiety, an imidazole moiety, a pyrimidine moiety, a benzoxazole moiety, or a benzimidazole moiety. In some embodiments, the second comonomer repeat unit is a 3,4-benzo-1,2,5-thiadiazole moiety.

In some embodiments, the second comonomer repeat unit can include a benzothiadiazole moiety of formula (2), a thiadiazoloquinoxaline moiety of formula (3), a cyclopentadithiophene dioxide moiety of formula (4), a cyclopentadithiophene monoxide moiety of formula (5), a benzoisothiazole moiety of formula (6), a benzothiazole moiety of formula (7), a thiophene dioxide moiety of formula (8), a cyclopentadithiophene dioxide moiety of formula (9), a cyclopentadithiophene tetraoxide moiety of formula (10), a thienothiophene moiety of formula (11), a thienothiophene tetraoxide moiety of formula (12), a dithienothiophene moiety of formula (13), a dithienothiophene dioxide moiety of formula (14), a dithienothiophene tetraoxide moiety of formula (15), a tetrahydroisoindole moiety of formula (16), a thienothiophene dioxide moiety of formula (17), a dithienothiophene dioxide moiety of formula (18), a fluorene moiety of formula (19), a silole moiety of formula (20), a cyclopentadithiophene moiety of formula (21), a fluorenone moiety of formula (22), a thiazole moiety of formula (23), a selenophene moiety of formula (24), a thiazolothiazole moiety of formula (25), a cyclopentadithiazole moiety of formula (26), a naphthothiadiazole moiety of formula (27), a thienopyrazine moiety of formula (28), a silacyclopentadithiophene moiety of formula (29), an oxazole moiety of formula (30), an imidazole moiety of formula (31), a pyrimidine moiety of formula (32), a benzoxazole moiety of formula (33), or a benzimidazole moiety of formula (34):

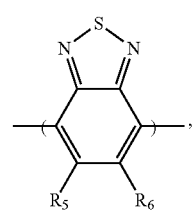

(2)

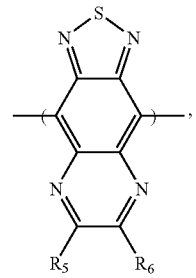

(3)

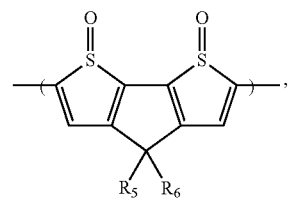

(4)

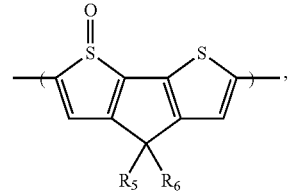

(5)

(6)
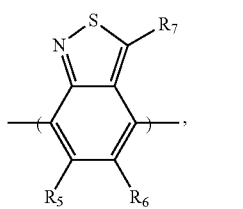
(7)
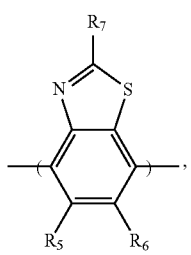
(8)
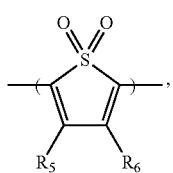
(9)
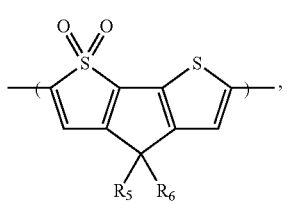
(10)
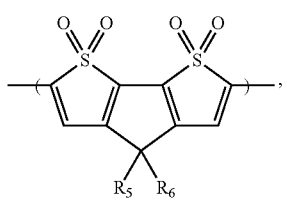
(11)
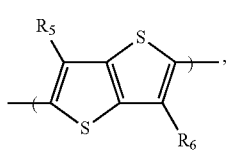
(12)
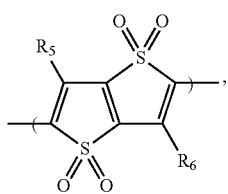
(13)
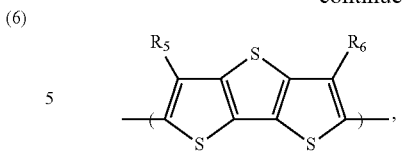
(14)
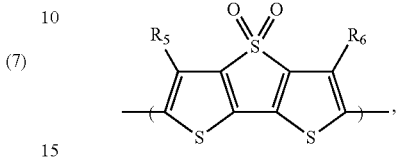
(15)
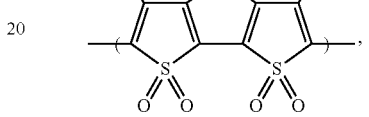
(16)
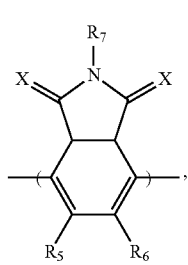
(17)
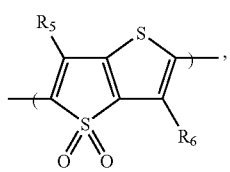
(18)
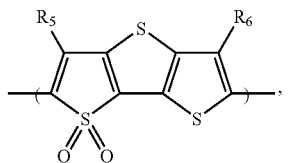
(19)
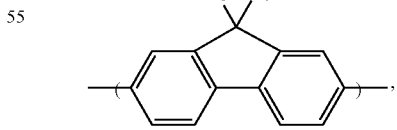
(20)
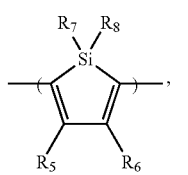

-continued

(21)
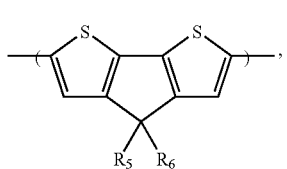

(22)
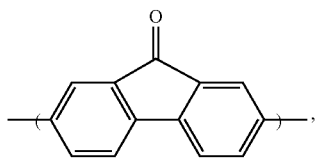

(23)
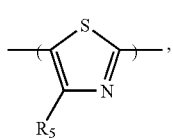

(24)
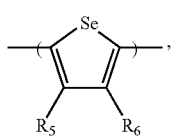

(25)
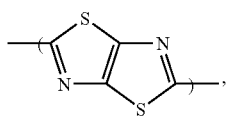

(26)
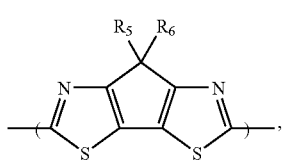

(27)
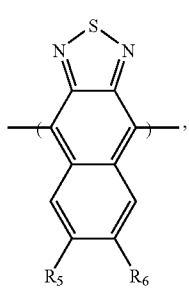

(28)
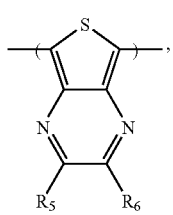

-continued

(29)
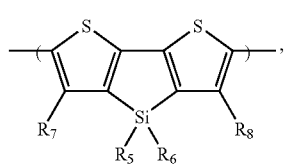

(30)
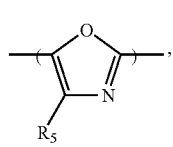

(31)
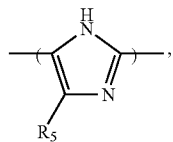

(32)
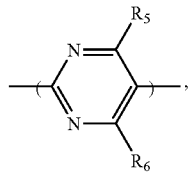

(33)
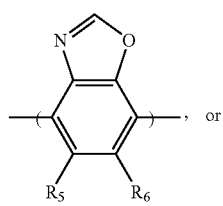, or

(34)
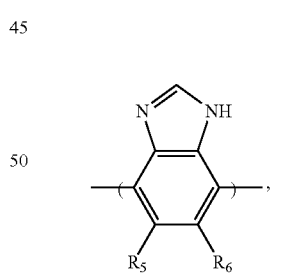

In the above formulas, each of X and Y, independently, is $CH_2$, O, or S; each of $R_5$ and $R_6$, independently, is H, $C_1$-$C_{20}$ alkyl, $C_1$-$C_{20}$ alkoxy, $C_3$-$C_{20}$ cycloalkyl, $C_1$-$C_{20}$ heterocycloalkyl, aryl, heteroaryl, halo, CN, OR, C(O)R, C(O)OR, or $SO_2R$, in which R is H, $C_1$-$C_{20}$ alkyl, $C_1$-$C_{20}$ alkoxy, aryl, heteroaryl, $C_3$-$C_{20}$ cycloalkyl, or $C_1$-$C_{20}$ heterocycloalkyl; and each of $R_7$ and $R_8$, independently, is H, $C_1$-$C_{20}$ alkyl, $C_1$-$C_{20}$ alkoxy, aryl, heteroaryl, $C_3$-$C_{20}$ cycloalkyl, or $C_3$-$C_{20}$ heterocycloalkyl. In some embodiments, the second comonomer repeat unit includes a benzothiadiazole moiety of formula (2), in which each of $R_5$ and $R_6$, is H.

The second comonomer repeat unit can include at least three thiophene moieties. In some embodiments, at least one of the thiophene moieties is substituted with at least one substituent selected from the group consisting of $C_1$-$C_{20}$ alkyl, $C_1$-$C_{20}$ alkoxy, aryl, heteroaryl, $C_3$-$C_{20}$ cycloalkyl, and $C_3$-$C_{20}$ heterocycloalkyl. In certain embodiments, the second comonomer repeat unit includes five thiophene moieties.

The polymer can further include a third comonomer repeat unit that contains a thiophene moiety or a fluorene moiety. In some embodiments, the thiophene or fluorene moiety is substituted with at least one substituent selected from the group consisting of $C_1$-$C_{20}$ alkyl, $C_1$-$C_{20}$ alkoxy, aryl, heteroaryl, $C_3$-$C_{20}$ cycloalkyl, and $C_3$-$C_{20}$ heterocycloalkyl.

In some embodiments, the polymer can be formed by any combination of the first, second, and third comonomer repeat units. In certain embodiments, the polymer can be a homopolymer containing any of the first, second, and third comonomer repeat units.

In some embodiments, the polymer can be

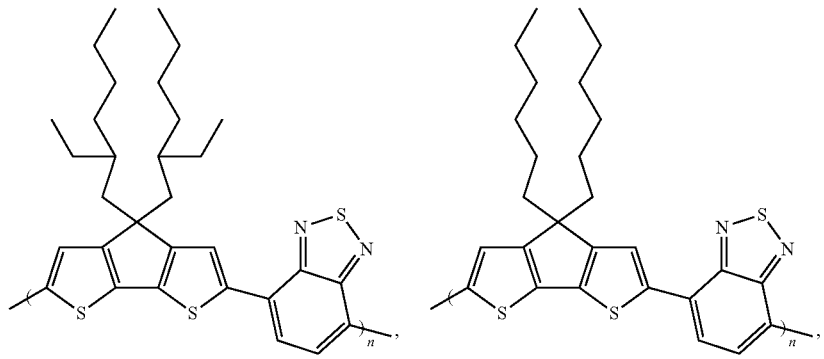

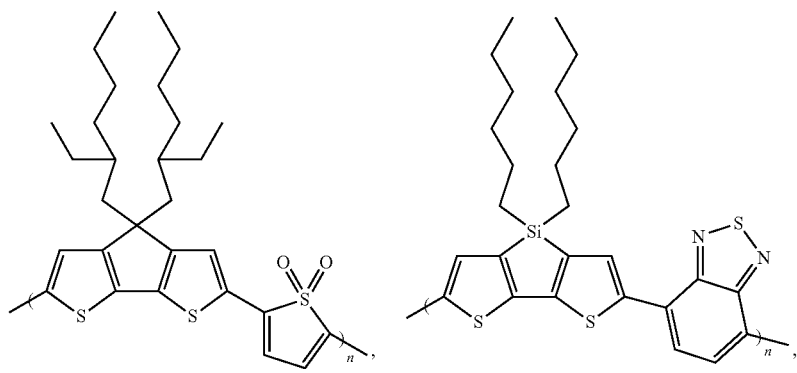

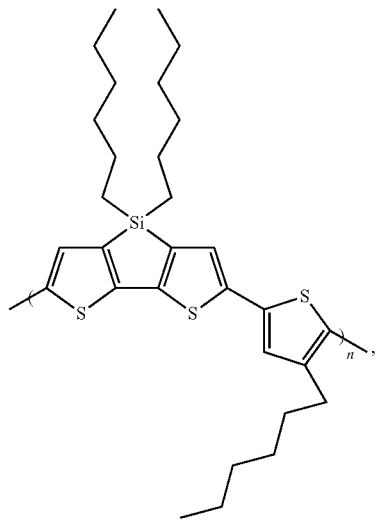

-continued

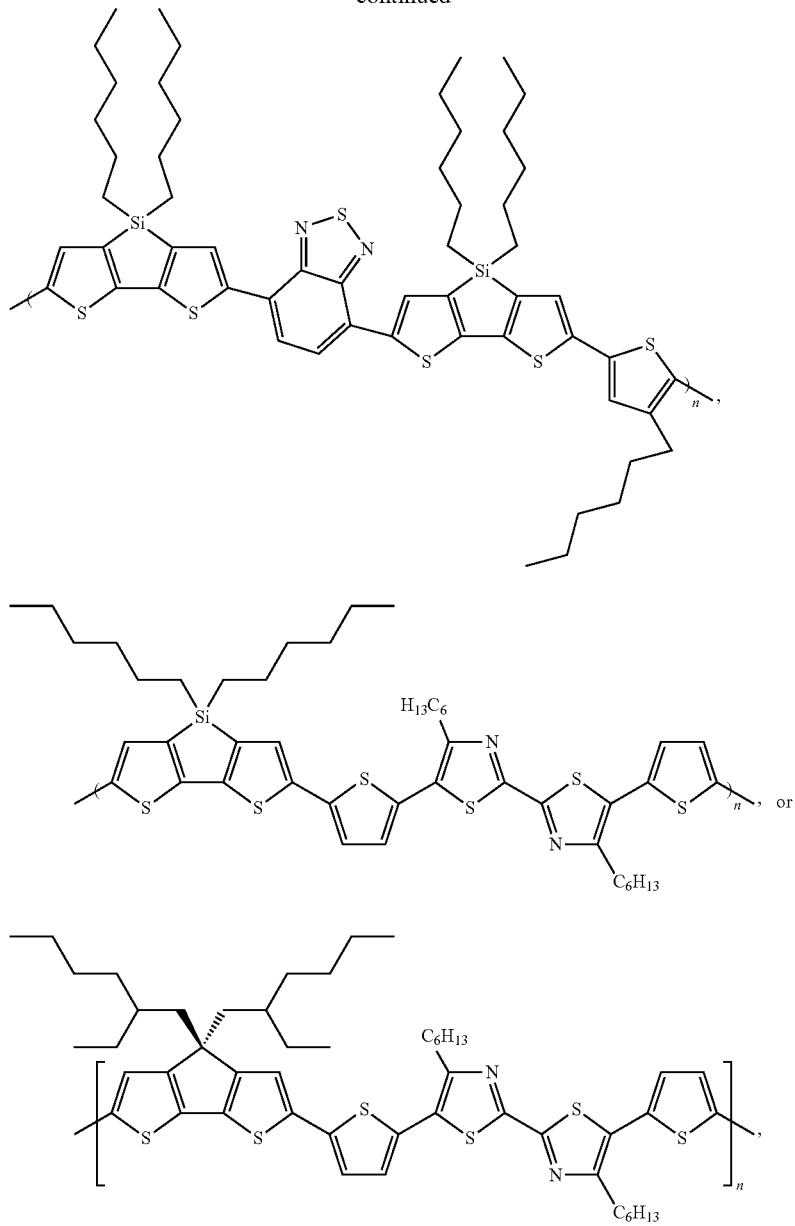

in which n can be an integer greater than 1.

The monomers for preparing the polymers mentioned herein may contain a non-aromatic double bond and one or more asymmetric centers. Thus, they can occur as racemates and racemic mixtures, single enantiomers, individual diastereomers, diastereomeric mixtures, and cis- or trans-isomeric forms. All such isomeric forms are contemplated.

The polymers described above can be prepared by methods known in the art, such as those described in commonly owned co-pending U.S. application Ser. No. 11/601,374, the contents of which are hereby incorporated by reference. For example, a copolymer can be prepared by a cross-coupling reaction between one or more comonomers containing two alkylstannyl groups and one or more comonomers containing two halo groups in the presence of a transition metal catalyst. As another example, a copolymer can be prepared by a cross-coupling reaction between one or more comonomers containing two borate groups and one or more comonomers containing two halo groups in the presence of a transition metal catalyst. The comonomers can be prepared by the methods know in the art, such as those described in U.S. patent application Ser. No. 11/486,536, Coppo et al., *Macromolecules* 2003, 36, 2705-2711, and Kurt et al., *J. Heterocycl. Chem.* 1970, 6, 629, the contents of which are hereby incorporated by reference.

Without wishing to be bound by theory, it is believed that an advantage of the polymers described above is that their absorption wavelengths shift toward the red and near IR regions (e.g., 650-800 nm) of the electromagnetic spectrum, which is not accessible by most other conventional polymers. When such a polymer is incorporated into a photovoltaic cell together with a conventional polymer, it enables the cell to absorb the light in this region of the spectrum, thereby increasing the current and efficiency of the cell.

Generally, photoactive layer 140 is sufficiently thick to be relatively efficient at absorbing photons impinging thereon to form corresponding electrons and holes, and sufficiently thin to be relatively efficient at transporting the holes and electrons. In certain embodiments, photoactive layer 140 is at least 0.05 micron (e.g., at least about 0.1 micron, at least about 0.2 micron, at least about 0.3 micron) thick and/or at most about one micron (e.g., at most about 0.5 micron, at most about 0.4 micron) thick. In some embodiments, photoactive layer 140 is from about 0.1 micron to about 0.2 micron thick.

Optionally, photovoltaic cell 100 can include a hole blocking layer 150. The hole blocking layer is generally formed of a material that, at the thickness used in photovoltaic cell 100, transports electrons to anode 160 and substantially blocks the transport of holes to anode 160. Examples of materials from which the hole blocking layer can be formed include LiF, metal oxides (e.g., zinc oxide, titanium oxide), and amines (e.g., primary, secondary, or tertiary amines). Examples of amines suitable for use in a hole blocking layer have been described, for example, in co-pending U.S. Provisional Application Ser. No. 60/926,459, the entire contents of which are hereby incorporated by reference.

Without wishing to be bound by theory, it is believed that when photovoltaic cell 100 includes a hole blocking layer made of amines, it can facilitate the formation of ohmic contact between photoactive layer 140 and anode 160, thereby reducing damage to photovoltaic cell 100 resulted from such exposure.

Typically, hole blocking layer 150 is at least 0.02 micron (e.g., at least about 0.03 micron, at least about 0.04 micron, at least about 0.05 micron) thick and/or at most about 0.5 micron (e.g., at most about 0.4 micron, at most about 0.3 micron, at most about 0.2 micron, at most about 0.1 micron) thick.

In some embodiments, hole blocking layer 150 can be prepared by the liquid-based coating process described above.

Anode 160 is generally formed of an electrically conductive material, such as one or more of the electrically conductive materials described above. In some embodiments, anode 160 is formed of a combination of electrically conductive materials. In certain embodiments, anode 160 can be formed of a mesh electrode.

Substrate 170 can be identical to or different from substrate 110. In some embodiments, substrate 170 can be formed of one or more suitable polymers, such as those described above.

In general, during use, light can impinge on the surface of substrate 110, and pass through substrate 110, cathode 120, and hole carrier layer 130. The light then interacts with photoactive layer 140, causing electrons to be transferred from the electron donor material (e.g., P3HT) to the electron acceptor material (e.g., a PCBM). The electron acceptor material then transmits the electrons through intermediate layer 150 to anode 160, and the electron donor material transfers holes through hole carrier layer 130 to cathode 120. Anode 160 and cathode 120 are in electrical connection via an external load so that electrons pass from anode 160, through the load, and to cathode 120.

While certain embodiments have been disclosed, other embodiments are also possible.

In some embodiments, while FIG. 1 shows that photovoltaic cell 100 includes cathode as a bottom electrode and anode as a top electrode, photovoltaic cell 100 can also include an anode as a bottom electrode and a cathode as a top electrode.

In some embodiments, photovoltaic cell 100 can include the layers shown in FIG. 1 in a reverse order. In other words, photovoltaic cell 100 can include these layers from the bottom to the top in the following sequence: a substrate 170, an anode 160, a hole blocking layer 150, a photoactive layer 140, a hole carrier layer 130, a cathode 120, and a substrate 110.

While photovoltaic cells have been described above, in some embodiments, the compositions and methods described herein can be used in tandem photovoltaic cells. Examples of tandem photovoltaic cells have been described in, for example, co-pending U.S. Application Publication No. 2007-0181179 and U.S. application Ser. No. 11/734,093, the entire contents of which are hereby incorporated by reference.

Figure 2:
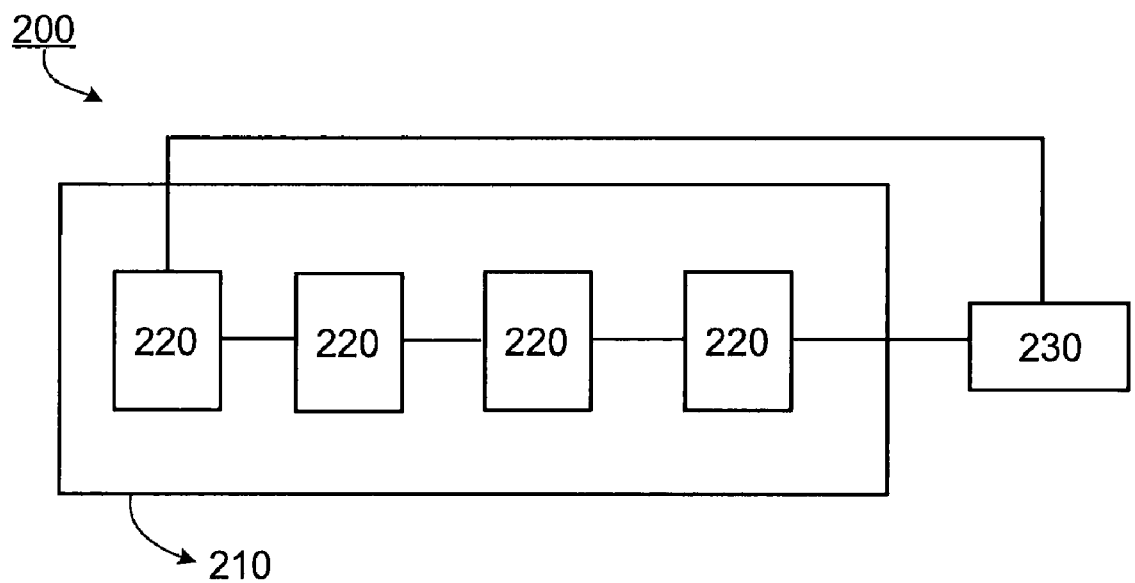
FIG. 2 is a schematic of a system containing multiple photovoltaic cells electrically connected in series.
Figure 3:
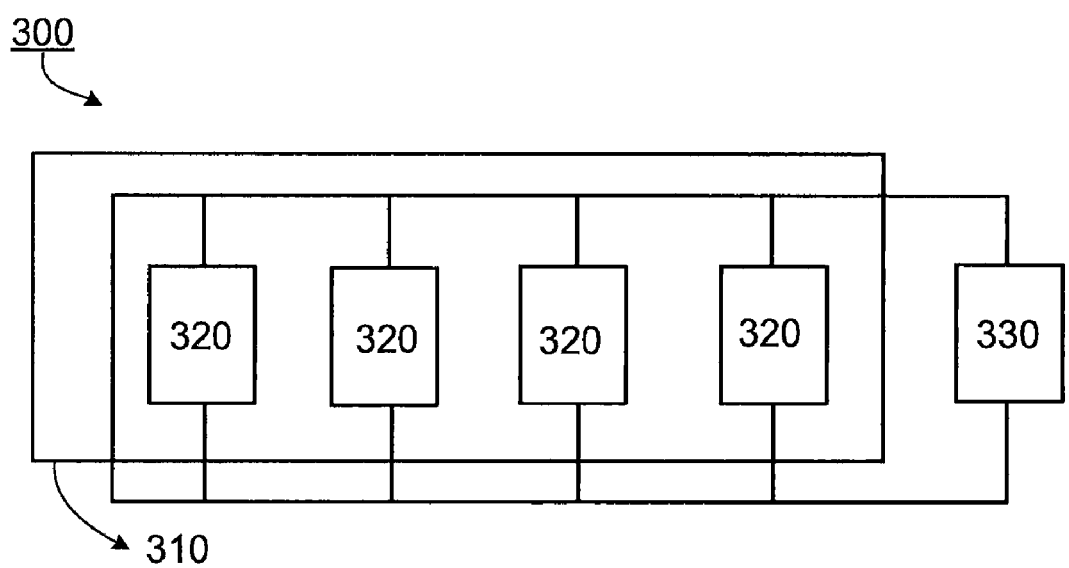
FIG. 3 is a schematic of a system containing multiple photovoltaic cells electrically connected in parallel.

In some embodiments, multiple photovoltaic cells can be electrically connected to form a photovoltaic system. As an example, FIG. 2 is a schematic of a photovoltaic system 200 having a module 210 containing photovoltaic cells 220. Cells 220 are electrically connected in series, and system 200 is electrically connected to a load 230. As another example, FIG. 3 is a schematic of a photovoltaic system 300 having a module 310 that contains photovoltaic cells 320. Cells 320 are electrically connected in parallel, and system 300 is electrically connected to a load 330. In some embodiments, some (e.g., all) of the photovoltaic cells in a photovoltaic system can have one or more common substrates. In certain embodiments, some photovoltaic cells in a photovoltaic system are electrically connected in series, and some of the photovoltaic cells in the photovoltaic system are electrically connected in parallel.

While photovoltaic cells have been described above, in some embodiments, the processing additives described herein can be used to prepare other electronic devices and systems. For example, the processing additives can be used in suitable organic semiconductive devices, such as field effect transistors, photodetectors (e.g., IR detectors), photovoltaic detectors, imaging devices (e.g., RGB imaging devices for cameras or medical imaging systems), light emitting diodes (LEDs) (e.g., organic LEDs or IR or near IR LEDs), lasing devices, conversion layers (e.g., layers that convert visible emission into IR emission), amplifiers and emitters for telecommunication (e.g., dopants for fibers), storage elements (e.g., holographic storage elements), and electrochromic devices (e.g., electrochromic displays).

The following example is illustrative and not intended to be limiting.

EXAMPLE 1

Preparation of Photoactive Layers

Poly[2,6-(4,4-bis(2-ethylhexyl)-4H-cyclopenta[2,1-b;3,4-b']-dithiophene)-alt-4,7-(2,1,3-benzothiadiazole)] (PCPDTBT) and $C_{71}$-PCBM were obtained from Konarka Technologies, Inc.

Photoactive layers were prepared according to the following procedure: An indium tin oxide (ITO)-coated glass substrate was first cleaned with a detergent, ultra-sonicated in acetone and isopropyl alcohol, and dried overnight in an oven. Poly(3,4-ethylene-dioxythiophene):poly(styrensulfonate) PEDOT:PSS (BAYTRON P) was subsequently spin-cast on the ITO-coated glass substrate from an aqueous solution to form a PEDOT layer of thickness around 40 nm. The substrate thus formed was then dried for 10 minutes at 140° C. in air and transferred into a glove-box. A solution containing a mixture of PCPDTBT/$C_{71}$-PCBM (1:3.6) in chlorobenzene with or without 2.5 vol % of a processing additive was then spin-cast on top of the PEDOT layer to form a photoactive layer. A PCPDTBT network film was prepared by rinsing the photoactive layer with 1,8-dithioloctane for 5 seconds to remove $C_{71}$-PCBM.

The AFM images were obtained with a Dimension 3100 atomic force microscope for photoactive layers prepared by using the following six processing additives: (1) 1,8-octanedithiol, (2) 1,8-dichlorooctane, (3) 1,8-dibromooctane, (4) 1,8-diiodooctane, (5) 1,8-dicyanooctane, and (6) 1,8-di(methoxycarbonyl)octane. The results showed that the photoactive layers prepared by using 1,8-octanedithiol, 1,8-dibromooctane, and 1,8-diiodooctane exhibited finer domain size than those prepared by using 1,8-dichlorooctane, 1,8-dicyanooctane, and 1,8-octanediacetate. The results also showed that the photoactive layer prepared by using 1,8-diiodooctane exhibited more elongated domains than those prepared by using 1,8-octanedithiol and 1,8-dibromooctane.

TEM specimens were prepared by detaching a photoactive layer from the substrate onto the surface of deionized water and picking it up with a copper grid. TEM images were obtained with a FEI T20 transmission electron microscope operated at 200 kV under proper defocus conditions for three photoactive layers: (1) a photoactive layer prepared without using any processing additive, (2) a photoactive layer prepared using 1,8-octanedithiol as a processing additive, and (3) a photoactive layer prepared using 1,8-diiodooctane as a processing additive. The results showed that photoactive layers (2) and (3) exhibited larger scale phase-separation than photoactive layer (1) and that photoactive layer (3) had more elongated fibril-like domains than photoactive layer (2).

EXAMPLE 2

Fabrication of Photovoltaic Cells

Photovoltaic cells were fabricated in a similar manner as that described in Example 1 except that a metal electrode was placed onto the photoactive layer. The performances of the cells were determined under simulated 100 mW/cm$^2$ AM 1.5G illumination and were summarized in Table 1 below. The light intensity was measured using calibrated standard silicon solar cells with a proactive window made from KG5 filter glass traced to the National Renewable Energy Laboratory. The active area of each photovoltaic cell was 4.5 mm$^2$.

TABLE 1

Performances of photovoltaic cells fabricated with various processing additives

| Additives | $J_{sc}$ (mA/cm$^2$) | $V_{oc}$ (V) | Fill Factor | Efficiency (%) |
| --- | --- | --- | --- | --- |
| none | 11.74 | 0.66 | 0.43 | 3.35 |
| HS—C$_8$H$_{16}$—SH | 14.48 | 0.64 | 0.49 | 4.50 |
| Cl—C$_8$H$_{16}$—Cl | 3.55 | 0.35 | 0.33 | 0.41 |
| Br—C$_8$H$_{16}$—Br | 15.26 | 0.64 | 0.48 | 4.66 |
| I—C$_8$H$_{16}$—I | 15.73 | 0.61 | 0.53 | 5.12 |
| NC—C$_8$H$_{16}$—CN | 7.98 | 0.63 | 0.47 | 2.38 |
| CH$_3$O$_2$C—C$_8$H$_{16}$—CO$_2$CH$_3$ | 7.84 | 0.64 | 0.47 | 2.38 |

Other embodiments are in the claims.

What is claimed is:

1. A method, comprising:
processing a solution to form a photoactive layer, the solution comprising an electron donor material, an electron acceptor material, a compound, and a solvent, the compound being different from the solvent and being selected from a group consisting of an alkane substituted with halo, CN, or COOR, R being H or C$_1$-C$_{10}$ alkyl; a cyclopentadithiophene optionally substituted with C$_1$-C$_{10}$ alkyl; a fluorene optionally substituted with C$_1$-C$_{10}$ alkyl; a thiophene optionally substituted with C$_1$-C$_{10}$ alkyl; a benzothiadiazole optionally substituted with C$_1$-C$_{10}$ alkyl; a naphthalene optionally substituted with C$_1$-C$_{10}$ alkyl; and a 1,2,3,4-tetrahydronaphthalene optionally substituted with C$_1$-C$_{10}$ alkyl.

2. The method of claim 1, wherein the compound is an alkane substituted with Cl, Br, I, CN, or COOCH$_3$.

3. The method of claim 1, wherein the alkane is a C$_6$-C$_{12}$ alkane.

4. The method of claim 1, wherein the alkane is an octane.

5. The method of claim 1, wherein the compound is 1,8-diiodooctane, 1,8-dibromooctane, 1,8-dicyanooctane, or 1,8-di(methoxycarbonyl)octane.

6. The method of claim 1, wherein the compound is of the following formula:

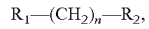

in which n is 1-20; and each of R$_1$ and R$_2$, independently, is halo, CN, or COOR, R being H or C$_1$-C$_{10}$ alkyl.

7. The method of claim 6, wherein n is 6-12.

8. The method of claim 6, wherein n is 8.

9. The method of claim 6, wherein each of R$_1$ and R$_2$, independently, is Cl, Br, I, CN, or COOCH$_3$.

10. The method of claim 1, wherein the solution comprises at least about 1 vol % of the compound.

11. The method of claim 1, wherein the solution comprises at most about 10 vol % of the compound.

12. The method of claim 1, wherein the electron donor material is selected from the group consisting of polythiophenes, polyanilines, polycarbazoles, polyvinylcarbazoles, polyphenylenes, polyphenylvinylenes, polysilanes, polythienylenevinylenes, polyisothianaphthanenes, polycyclopentadithiophenes, polysilacyclopentadithiophenes, polycyclopentadithiazoles, polythiazolothiazoles, polythiazoles, polybenzothiadiazoles, poly(thiophene oxide)s, poly(cyclopentadithiophene oxide)s, polythiadiazoloquinoxaline, polybenzoisothiazole, polybenzothiazole, polythienothiophene, poly(thienothiophene oxide), polydithienothiophene, poly(dithienothiophene oxide)s, polyfluorenes, polytetrahydroisoindoles, and copolymers thereof.

13. The method of claim 12, wherein the electron donor material comprises polythiophenes, polycyclopentadithiophenes, or copolymers thereof.

14. The method of claim 13, wherein the electron donor material comprises poly(3-hexylthiophene) or poly(cyclopentadithiophene-co-benzothiadiazole).

15. The method of claim 1, wherein the electron acceptor material comprises a material selected from the group consisting of fullerenes, inorganic nanoparticles, oxadiazoles, discotic liquid crystals, carbon nanorods, inorganic nanorods, polymers containing CN groups, polymers containing CF$_3$ groups, and combinations thereof.

16. The method of claim 15, wherein the electron acceptor material comprises a substituted fullerene.

17. The method of claim 16, wherein the substituted fullerene comprises [6,6]-phenyl C61-butyric acid methyl ester or [6,6]-phenyl C71-butyric acid methyl ester.

18. The method of claim 1, wherein the solvent comprises chlorobenzene, o-dichlorobenzene, trichlorobenzene, o-xylene, m-xylene, p-xylene, toluene, mesitylene, ethylbenzene, isobutylbenzene, t-butylbenzene, α-methylnaphthalene, tetralin, N-methylpyrrolidone, methyl ethyl ketone, or acetone.

19. The method of claim 1, wherein the processing step comprises applying the solution on a surface.

20. The method of claim 19, wherein the processing step further comprises drying the solution after the applying step to form the photoactive layer.

21. The method of claim 1, further comprising disposing the photoactive layer between first and second electrodes to form a photovoltaic cell.

22. A method, comprising:
processing a solution comprising a compound to form a photoactive layer, the compound being selected from a group consisting of a substituted alkane of the following formula: $R_1$—$(CH_2)_n$—$R_2$, in which n is 2-20; and each of $R_1$ and $R_2$, independently, is halo, CN, or COOR, R being H or $C_1$-$C_{10}$ alkyl; a cyclopentadithiophene optionally substituted with $C_1$-$C_{10}$ alkyl; a fluorene optionally substituted with $C_1$-$C_{10}$ alkyl; a thiophene optionally substituted with $C_1$-$C_{10}$ alkyl; and a benzothiadiazole optionally substituted with $C_1$-$C_{10}$ alkyl.

23. The method of claim 22, wherein n is 6-12.

24. The method of claim 22, wherein n is 8.

25. The method of claim 22, wherein each of $R_1$ and $R_2$, independently, is Cl, Br, I, CN, or $COOCH_3$.

26. The method of claim 22, wherein the solution comprises at least about 1 vol % of the compound.

27. The method of claim 22, wherein the solution comprises at most about 10 vol % of the compound.

28. The method of claim 22, wherein the solution further comprises an electron donor material.

29. The method of claim 28, wherein the electron donor material is selected from the group consisting of polythiophenes, polyanilines, polycarbazoles, polyvinylcarbazoles, polyphenylenes, polyphenylvinylenes, polysilanes, polythienylenevinylenes, polyisothianaphthanenes, polycyclopentadithiophenes, polysilacyclopentadithiophenes, polycyclopentadithiazoles, polythiazolothiazoles, polythiazoles, polybenzothiadiazoles, poly(thiophene oxide)s, poly(cyclopentadithiophene oxide)s, polythiadiazoloquinoxaline, polybenzoisothiazole, polybenzothiazole, polythienothiophene, poly(thienothiophene oxide), polydithienothiophene, poly(dithienothiophene oxide)s, polyfluorenes, polytetrahydroisoindoles, and copolymers thereof.

30. The method of claim 29, wherein the electron donor material comprises polythiophenes, polycyclopentadithiophenes, or copolymers thereof.

31. The method of claim 30, wherein the electron donor material comprises poly(3-hexylthiophene) or poly(cyclopentadithiophene-co-benzothiadiazole).

32. The method of claim 22, wherein the solution further comprises an electron acceptor material.

33. The method of claim 32, wherein the electron acceptor material comprises a material selected from the group consisting of fullerenes, inorganic nanoparticles, oxadiazoles, discotic liquid crystals, carbon nanorods, inorganic nanorods, polymers containing CN groups, polymers containing $CF_3$ groups, and combinations thereof.

34. The method of claim 33, wherein the electron acceptor material comprises a substituted fullerene.

35. The method of claim 34, wherein the substituted fullerene comprises [6,6]-phenyl C61-butyric acid methyl ester or [6,6]-phenyl C71-butyric acid methyl ester.

36. The method of claim 22, wherein the solution further comprises a solvent.

37. The method of claim 36, wherein the solvent comprises chlorobenzene, o-dichlorobenzene, trichlorobenzene, o-xylene, m-xylene, p-xylene, toluene, mesitylene, ethylbenzene, isobutylbenzene, t-butylbenzene, α-methylnaphthalene, tetralin, N-methylpyrrolidone, methyl ethyl ketone, or acetone.

38. The method of claim 22, wherein the processing step comprises applying the solution on a surface.

39. The method of claim 38, wherein the processing step further comprises drying the solution after the applying step to form the photoactive layer.

40. The method of claim 22, further comprising disposing the photoactive layer between first and second electrodes to form a photovoltaic cell.

* * * * *